(12) United States Patent
Chiu et al.

(10) Patent No.: US 8,524,531 B2
(45) Date of Patent: Sep. 3, 2013

(54) SYSTEM AND METHOD FOR IMPROVING SOLDER JOINT RELIABILITY IN AN INTEGRATED CIRCUIT PACKAGE

(71) Applicant: STMicroelectronics, Inc., Coppell, TX (US)

(72) Inventors: Anthony M. Chiu, Richardson, TX (US); Tong Yan Tee, Singapore (SG)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/671,669

(22) Filed: Nov. 8, 2012

(65) Prior Publication Data
US 2013/0130492 A1    May 23, 2013

Related U.S. Application Data

(62) Division of application No. 10/746,745, filed on Dec. 24, 2003.

(51) Int. Cl.
*H01L 21/00* (2006.01)

(52) U.S. Cl.
USPC ............................ 438/106; 438/121; 438/612

(58) Field of Classification Search
USPC ........................................ 438/106, 121, 612
See application file for complete search history.

(56) References Cited

U.S. PATENT DOCUMENTS

| | | | | |
|---|---|---|---|---|
| 5,844,306 | A * | 12/1998 | Fujita et al. | 257/676 |
| 6,646,332 | B2 * | 11/2003 | Collier | 257/678 |
| 6,650,020 | B2 * | 11/2003 | Yamada et al. | 257/783 |
| 6,777,788 | B1 * | 8/2004 | Wan et al. | 257/670 |
| 6,995,459 | B2 * | 2/2006 | Lee et al. | 257/676 |
| 2002/0063315 | A1 * | 5/2002 | Huang et al. | 257/666 |
| 2003/0001244 | A1 * | 1/2003 | Araki et al. | 257/666 |
| 2003/0006055 | A1 * | 1/2003 | Chien-Hung et al. | 174/52.1 |

* cited by examiner

*Primary Examiner* — Douglas Menz
(74) *Attorney, Agent, or Firm* — Munck Wilson Mandala, LLP

(57) ABSTRACT

Solder joint reliability in an integrated circuit package is improved. Each terminal of a quad, flat, non-leaded integrated circuit package is formed having portions that define a solder slot in the bottom surface of the terminal. An external surface of the die pad of the integrated circuit package is also formed having portions that define a plurality of solder slots on the periphery of the die pad. When solder is applied to the die pad and to the terminals, the solder that fills the solder slots increases the solder joint reliability of the integrated circuit package.

20 Claims, 4 Drawing Sheets

SYSTEM AND METHOD FOR IMPROVING SOLDER JOINT RELIABILITY IN AN INTEGRATED CIRCUIT PACKAGE

CROSS-REFERENCE TO RELATED APPLICATIONS

This application is a divisional of U.S. patent application Ser. No. 10/746,745, filed Dec. 24, 2003, now U.S. Pat. No. 8,330,258 which is incorporated herein by reference into this disclosure as if fully set forth herein.

TECHNICAL FIELD

The present disclosure is directed, in general, to integrated circuit packages and, more specifically, to a system and method for improving solder joint reliability in an integrated circuit package.

BACKGROUND

New types of integrated circuits are continually being developed. Some of the newer integrated circuit devices have an increased number of functions and operate at higher speeds than older types of integrated circuits. The newer types of integrated circuits often produce more heat and operate at higher device temperatures than older types of integrated circuits.

The semiconductor industry has been developing newer types of integrated circuit packages for providing efficient and cost effective heat removal for such integrated circuits. The design goal is to make plastic integrated circuit packages that are smaller, thinner, cooler, cheaper, and easy and quick to manufacture.

One of the newer types of integrated circuit package is a leadless package family that is referred to as QFN. The letters QFN stand for Quad, Flat, Non-leaded. QFN integrated circuit packages are plastic semiconductor packages with metal terminals located on the bottom of the package body along the periphery of the package body. The terminals are essentially flush with the bottom of the surface of the plastic package body. For this reason, QFN packages are categorized as "flat" and "non-leaded."

QFN packages have terminals on all four sides of the bottom of the package. For this reasons, QFN packages are categorized as "Quad" packages. QFN packages can have either a square body or a rectangular body. QFN packages can have either symmetric or non-symmetric terminal patterns.

When QFN packages are attached to an underlying printed circuit board, solder is applied to a leadframe that forms the bottom of the QFN package. Solder is also applied to each of the metal terminals on the periphery of the QFN package. A solder joint is formed between the QFN package and the printed circuit board to attach the leadframe and the terminals of the QFN package and the printed circuit board.

The solder joint between the printed circuit board and the QFN integrated circuit package may be subjected to physical or thermal stresses. If the stress on the solder joint reaches sufficiently high levels then the solder joint may crack and the solder material may delaminate. This may cause the QFN integrated circuit package to become electrically (and even physically) disconnected from the underlying printed circuit board.

There is therefore a need in the art for an improved system and method for providing a strong solder joint between a QFN integrated circuit package and a printed circuit board. There is generally a need in the art for an improved system and method for increasing the solder joint reliability in a QFN integrated circuit package.

SUMMARY

To address the deficiencies discussed above, it is a primary object of the present disclosure to provide a system and method for providing improving solder joint reliability in a QFN integrated circuit package.

The present disclosure comprises an improved system and method for increasing the strength of a solder joint between a QFN integrated circuit package and an underlying printed circuit board. Each terminal of a QFN integrated circuit package is formed having portions that define a solder slot in the bottom surface of the terminal. The external bottom surface of the die pad of the leadframe of the integrated circuit package is also formed having portions that define a plurality of solder slots on the periphery of the die pad.

When the QFN integrated circuit package is soldered to an underlying printed circuit board then solder is applied to the external bottom surface of the die pad and to the terminals. The applied solder also fills the solder slots in the external bottom surface of the die pad and also fills the solder slots in the terminals. The remaining areas (i.e., the areas not having solder slots) will also be coated by solder after the solder reflow process. The solder that fills the solder slots strengthens the solder bond against the lateral forces that the solder bond may experience. In this manner the solder within the solder slots increases the solder joint reliability of the QFN integrated circuit package.

It is an object of the present disclosure to provide an improved system and method for improving solder joint reliability in a QFN integrated circuit package.

It is also an object of the present disclosure to provide an improved system and method for increasing the strength of a solder bond between a QFN integrated circuit package and an underlying printed circuit board.

It is another object of the present disclosure to provide solder slots within at least a portion of the terminals of a QFN integrated circuit package.

It is yet another object of the present disclosure to provide solder slots within the external bottom surface of the die pad of a leadframe of a QFN integrated circuit package.

The foregoing has outlined rather broadly the features and technical advantages of the present disclosure so that those skilled in the art may better understand the detailed description of the disclosure that follows. Additional features and advantages of the disclosure will be described hereinafter that form the subject of the claims of the disclosure. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION OF THE DISCLOSURE below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged QFN integrated circuit package.

In particular, the apparatus and method of the present disclosure will be described for an integrated circuit package that has terminals on four (4) sides. It is understood that the integrated circuit package with four (4) sides is merely an example and that the apparatus and method of the disclosure may be applied to any number of sides (e.g., one, two, three, or four) of an integrated circuit package.

Figure 1:
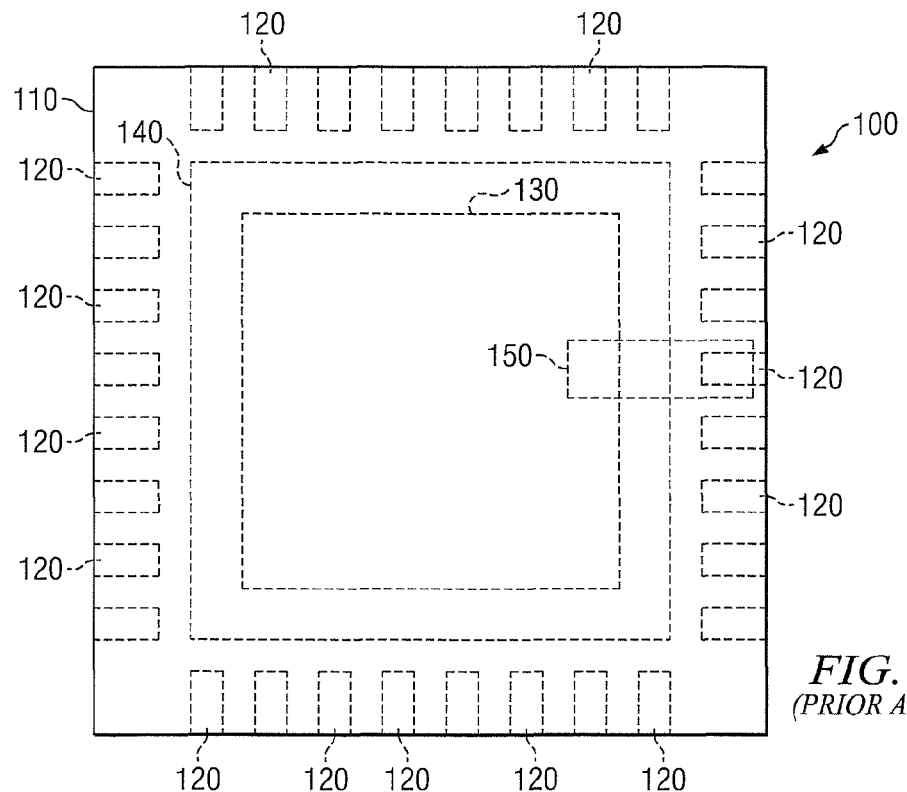
FIG. 1 illustrates a top view of an exemplary QFN integrated circuit package illustrating the placement of an integrated circuit die within the QFN integrated circuit package.

FIG. 1 illustrates a top view of an exemplary QFN (quad, flat, non-leaded) integrated circuit package 100. QFN integrated circuit package 100 comprises a plastic body 110 and a plurality of metal terminals 120 on the periphery of plastic body 110 of integrated circuit package 100. Because the plurality of metal terminals 120 are located on the bottom of QFN integrated circuit package 100, the plurality of metal terminals 120 are shown in dotted outline in the top view illustrated in FIG. 1.

The exemplary QFN integrated circuit package 100 shown in FIG. 1 is in the form of a square. In alternative embodiments, the QFN integrated circuit package 100 may be in the form of a rectangle. Each of the four (4) sides of the exemplary square prior art QFN integrated circuit package 100 comprises eight (8) metal terminals 120.

An integrated circuit die 130 is mounted on a die pad portion 140 of the plastic body 110 of the QFN integrated circuit package 100. That is, die pad 140 of plastic body 110 is a flat portion of the leadframe on which the integrated circuit die 130 is mounted. Integrated circuit die 130 is then covered with additional plastic material of plastic body 110 and embedded within plastic body 110. Because integrated circuit die 130 is embedded in plastic body 110 within the interior of QFN integrated circuit package 100, integrated circuit die 130 is shown in dotted outline in FIG. 1. For simplicity the term QFN will be omitted hereafter in the description.

The construction of integrated circuit package 100 may be better understood by considering a cross sectional portion of the integrated circuit package 100 that is located under the dotted rectangle 150 shown in FIG. 1.

Figure 2:
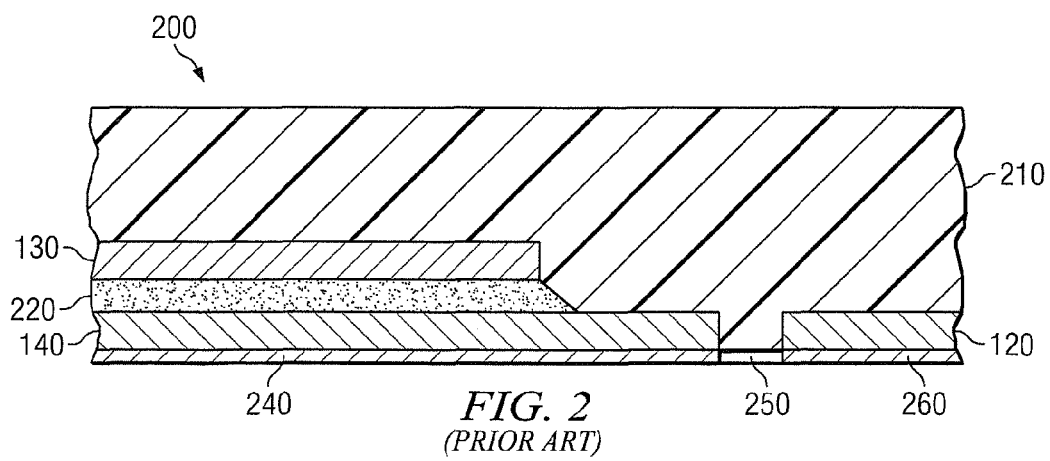
FIG. 2 illustrates a sectional side view of a portion of the exemplary QFN integrated circuit package of FIG. 1 that is located under a dotted rectangle shown on the top surface of the prior art QFN integrated circuit package.

FIG. 2 illustrates a sectional side view of a portion 200 of the exemplary integrated circuit package 100 of FIG. 1 that is located under dotted rectangle 150. The thicknesses of the various components of prior art integrated circuit package 100 have been enlarged in some instances for the sake of clarity in explanation. Integrated circuit die 130 is attached to die pad 140 with die attach material 220. Mold compound material 210 covers integrated circuit die 130, die attach material 220, die pad 140 and terminal 120. Mold compound material 210 also fills the space between die pad 140 and terminal 120.

Solder is used to fasten the bottom of the prior art integrated circuit package 100 to a printed circuit board (not shown). A layer of solder 240 is applied to the bottom of die pad 140 and a layer of solder 260 is applied to the bottom of terminal 120. A gap 250 exists between solder layer 240 and solder layer 260 where no solder is placed.

Figure 3:
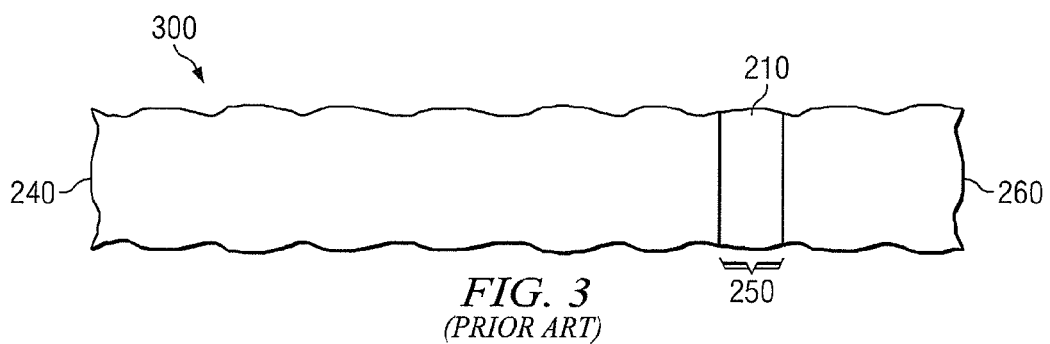
FIG. 3 illustrates a bottom view of the portion of the exemplary QFN integrated circuit package shown in FIG. 2.

This may be more clearly seen with reference to FIG. 3. FIG. 3 illustrates a bottom view 300 of the sectional portion of the exemplary circuit 100 shown in FIG. 2. Solder layer 240 is applied to die pad 140 and attaches die pad 140 to an underlying printed circuit board (not shown). Solder layer 260 is applied to terminal 120 and attaches terminal 120 to the underlying printed circuit board (not shown). Mold compound material 210 between die pad 140 and terminal 120 may be seen through gap 250 between solder layer 240 and solder layer 260.

Figure 4:
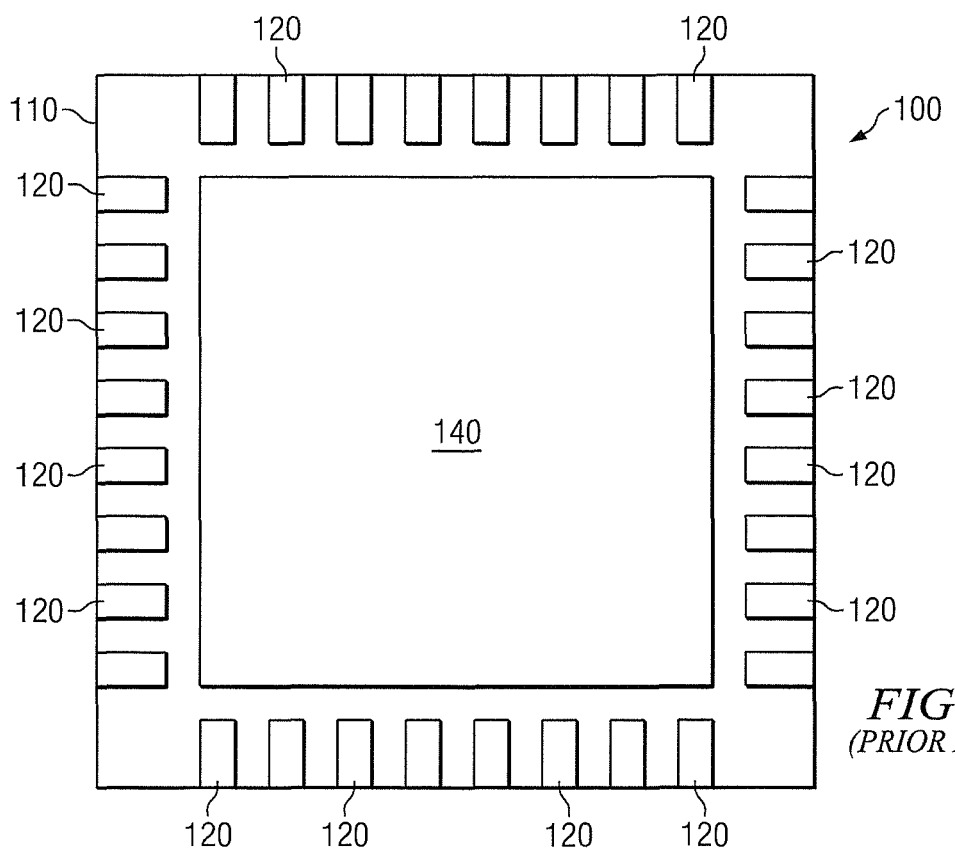
FIG. 4 illustrates a bottom view of the exemplary QFN integrated circuit package shown in FIG. 1.

FIG. 4 illustrates a bottom view of the exemplary integrated circuit package 100 shown in FIG. 1. The flat bottom of each of the thirty two (32) terminals 120 shown in FIG. 4 is accessible for soldering to a printed circuit board (not shown). The flat bottom of die pad 140 is also accessible for soldering to a printed circuit board (not shown).

Figure 5:
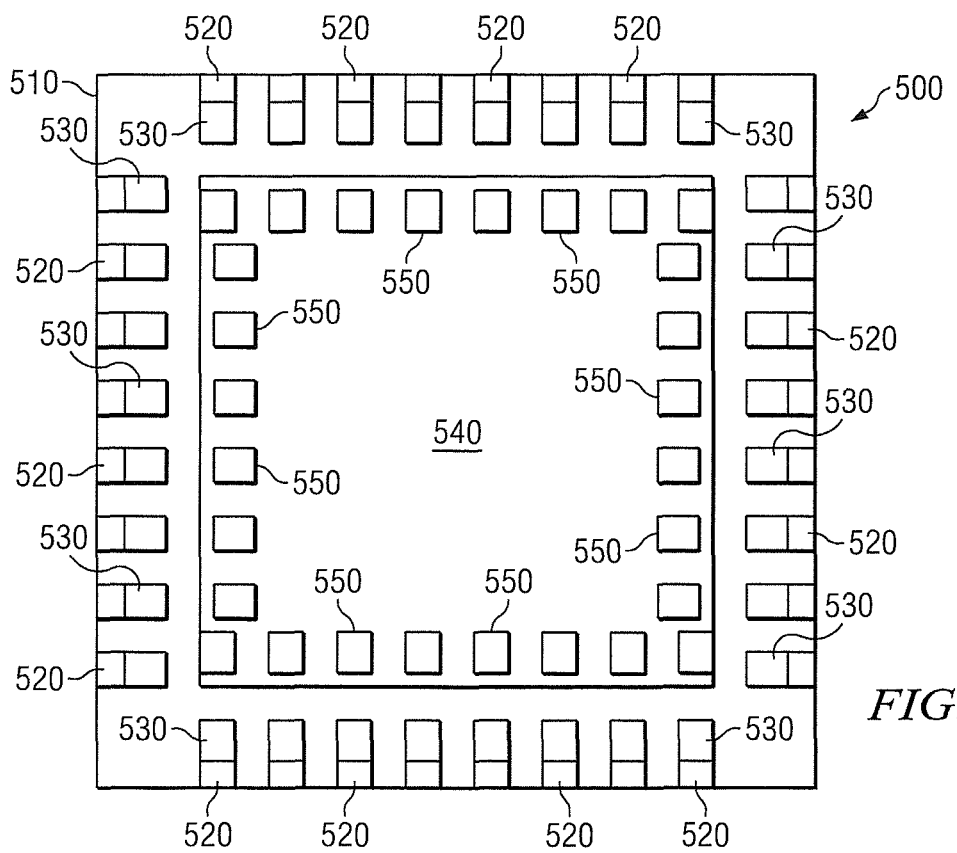
FIG. 5 illustrates a bottom view of an exemplary QFN integrated circuit package of the present disclosure showing locations where a plurality of solder slots are formed within the bottom of the QFN integrated circuit package.

FIG. 5 illustrates a bottom view of an exemplary integrated circuit package 500 of the present disclosure. Integrated circuit package 500 comprises a plastic body 510 and a plurality of metal terminals 520 on the periphery of plastic body 510 of integrated circuit package 500. Because the plurality of metal terminals 520 are located on the bottom of integrated circuit package 500, the plurality of metal terminals 520 are shown with solid lines in the bottom view illustrated in FIG. 5.

The exemplary integrated circuit package 500 that is shown in FIG. 5 is in the form of a square. In alternative embodiments of the disclosure, the integrated circuit package 500 may be in the form of a rectangle or in the form of any other shape. Each of the four (4) sides of the exemplary square integrated circuit package 500 comprises eight (8) metal terminals 520. The flat bottom of the integrated circuit package comprises die pad 540.

As shown in FIG. 5, a solder slot 530 is formed in the bottom of each of the thirty two (32) peripheral terminals 520 of integrated circuit package 500. Although the shape of the solder slots 530 is preferably square or rectangular, any shape may be used for a solder slot 530. In particular, a solder slot 530 may have a shape like the letter "L", a circular shape, an oval shape, or even an irregular shape. In one advantageous embodiment of the disclosure, each solder slot 530 is rectangular and has the dimensions of fifty five hundredths of a millimeter (0.55 mm) in length, forty hundredths of a millimeter (0.40 mm) in width, and five hundredths of a millimeter (0.05 mm) in depth for terminals that are one half millimeter (0.50 mm) wide. The location of the thirty two (32) solder slots 530 in the thirty two (32) peripheral terminals 520 is shown in shaded outline in FIG. 5. The peripheral terminals 520 (with solder slots 530) are accessible for soldering to a printed circuit board (not shown).

The present disclosure also comprises a plurality of solder slots 550 that are formed within the bottom surface of die pad 540 of integrated circuit package 500. The solder slots 550 are similar to solder slots 530. Although the shape of the solder slots 550 is preferably square or rectangular, any shape may be used for a solder slot 550. In particular, a solder slot 550 may have a shape like the letter "L", a circular shape, an oval shape, or even an irregular shape. In one advantageous embodiment of the disclosure, each solder slot 550 is rectangular and has the dimensions of fifty five hundredths of a millimeter (0.55 mm) in length, forty hundredths of a millimeter (0.40 mm) in width, and five hundredths of a millimeter (0.05 mm) in depth. The depth of this solder slot 550 is about fifty percent (50%) of the thickness of die pad 540. The location of thirty (30) solder slots 550 around the periphery of die pad 540 is shown in shaded outline in FIG. 5. The die pad 540 (with solder slots 550) is accessible for soldering to a printed circuit board (not shown).

When integrated circuit package 500 is soldered to a printed circuit board (not shown), the presence of solder in the solder slots 530 and in the solder slots 550 provides increased solder strength between the surfaces of the integrated circuit package 500 and the printed circuit board (not shown). The solder that fills the solder slots (530 and 550) strengthens the solder bond against lateral forces that the solder bond may experience. In this manner the solder within the solder slots (530 and 550) increases the solder joint reliability of the integrated circuit package 500.

In the advantageous embodiment shown in FIG. 5 the solder slots 530 in the terminals 520 are aligned with the solder slots 550 in the die pad 540. This alignment increases the solder bond strength by locating the solder slots 530 adjacent to corresponding solder slots 550. In other advantageous embodiments of the present disclosure the two types of solder slots may not be so aligned.

Figure 6:
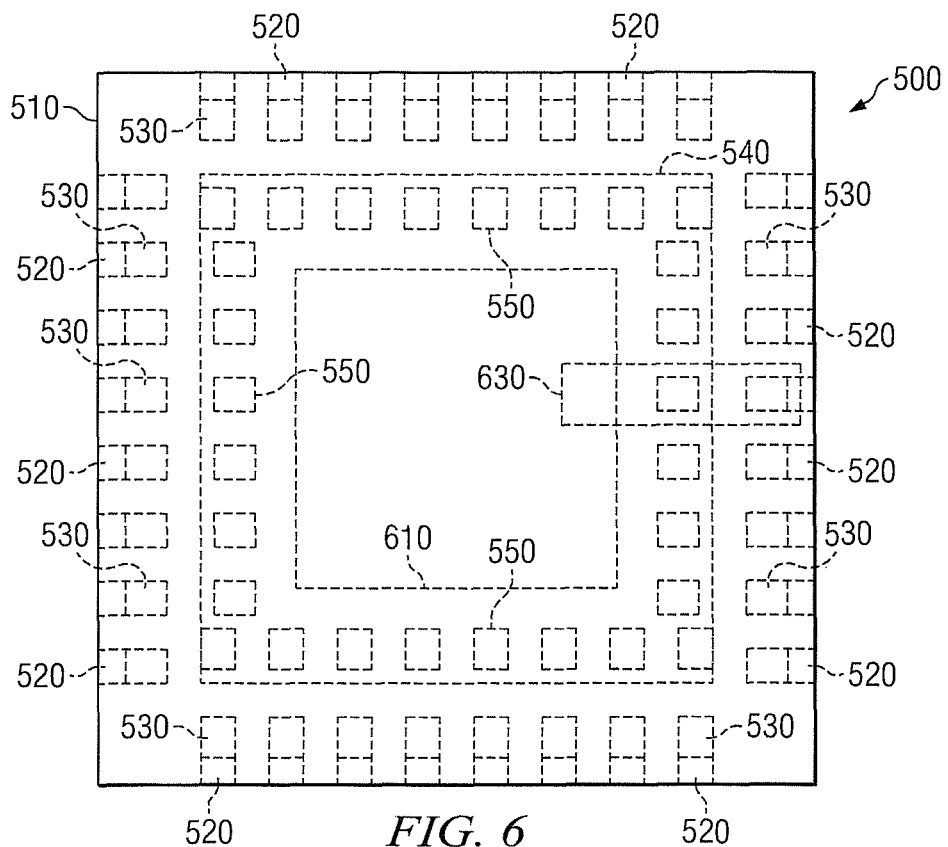
FIG. 6 illustrates a top view of an exemplary QFN integrated circuit package of the present disclosure.

FIG. 6 illustrates a top view of integrated circuit package 500 of the present disclosure showing the location of the plurality of metal terminals 520 on the periphery of plastic body 510. Because the plurality of metal terminals 520 are located on the bottom of integrated circuit package 500, the plurality of metal terminals 520 are shown in dotted outline in the top view illustrated in FIG. 6.

An integrated circuit die 610 is mounted on a die pad portion 540 of the plastic body 510 of the integrated circuit package 500. That is, die pad 540 of plastic body 510 is a flat portion of the leadframe on which integrated circuit die 610 is mounted. Integrated circuit die 610 is then covered with additional plastic material of plastic body 510 and embedded within plastic body 510. Because integrated circuit die 610 is embedded in plastic body 510 within the interior of integrated circuit package 500, integrated circuit die 610 is shown in dotted outline in FIG. 6.

The locations of the plurality of solder slots 530 in the plurality of metal terminals 520 are also shown in FIG. 6. Because the plurality of metal terminals 520 with solder slots 530 are located on the bottom of integrated circuit package 500, the plurality of metal terminals 520 and the plurality of solder slots 530 are shown in dotted outline in the top view illustrated in FIG. 6.

The location of the solder slots 550 in the periphery of the die pad 540 is also shown in FIG. 6. Because the die pad 540 is located on the bottom of integrated circuit package 500, the solder slots 550 are shown in dotted outline in the top view illustrated in FIG. 6.

The construction of integrated circuit package 500 may be better understood by considering a cross sectional portion of the integrated circuit package 500 that is located under the dotted rectangle 630 shown in FIG. 6.

Figure 7:
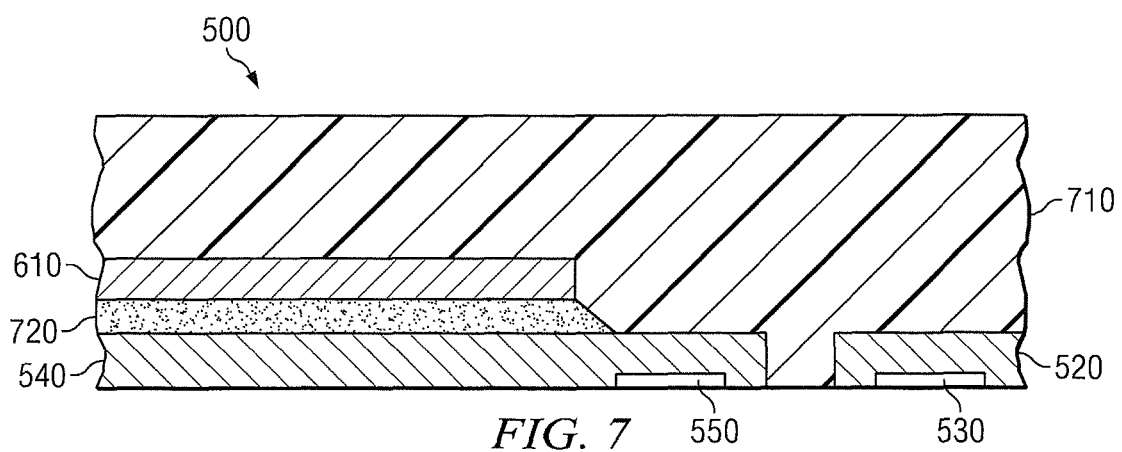
FIG. 7 illustrates a sectional side view of a portion of the exemplary QFN integrated circuit package of the present disclosure shown in FIG. 6 that is located under a dotted rectangle shown on the top surface of the QFN integrated circuit package showing a solder slot formed within a die pad of the QFN integrated circuit package and a solder slot formed within a terminal of the QFN integrated circuit package.

FIG. 7 illustrates a sectional side view of a portion of integrated circuit package 500 of FIG. 6 that is located under dotted rectangle 630. The thicknesses of the various components of integrated circuit package 500 have been enlarged in some instances for the sake of clarity in explanation. Integrated circuit die 610 is attached to die pad 540 with die attach material 720. Mold compound material 710 covers integrated circuit die 610, die attach material 720, die pad 540 and terminal 520. Mold compound material 710 also fills space between die pad 540 and terminal 520.

FIG. 7 also illustrates (in a sectional side view) the location of solder slot 530 within terminal 520. FIG. 7 also illustrates (in a sectional side view) the location of solder slot 550 within die pad 540.

Figure 8:
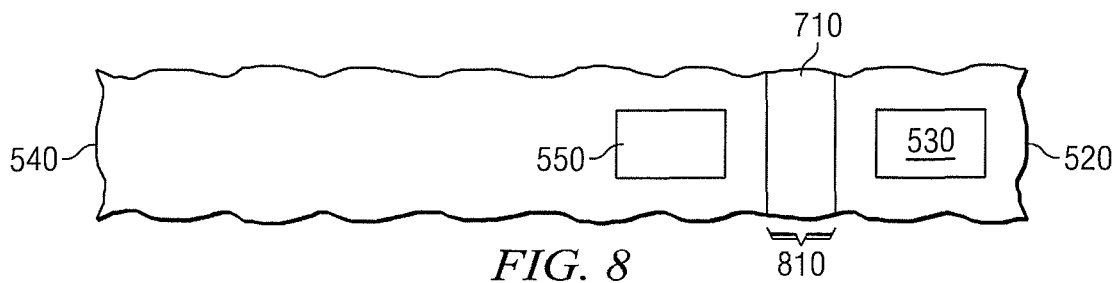
FIG. 8 illustrates a bottom view of the portion of the exemplary QFN integrated circuit package shown in FIG. 7.

FIG. 8 illustrates a bottom view of the portion of integrated circuit package 500 that is shown in FIG. 7. The location of solder slot 530 within terminal 520 is shown and the location of solder slot 550 within die pad 540 is shown. FIG. 8 also illustrates that a portion of mold compound 710 is located between die pad 540 and terminal 520. The width of this portion of mold compound 710 is designated with reference numeral 810 in FIG. 8.

Figure 9:
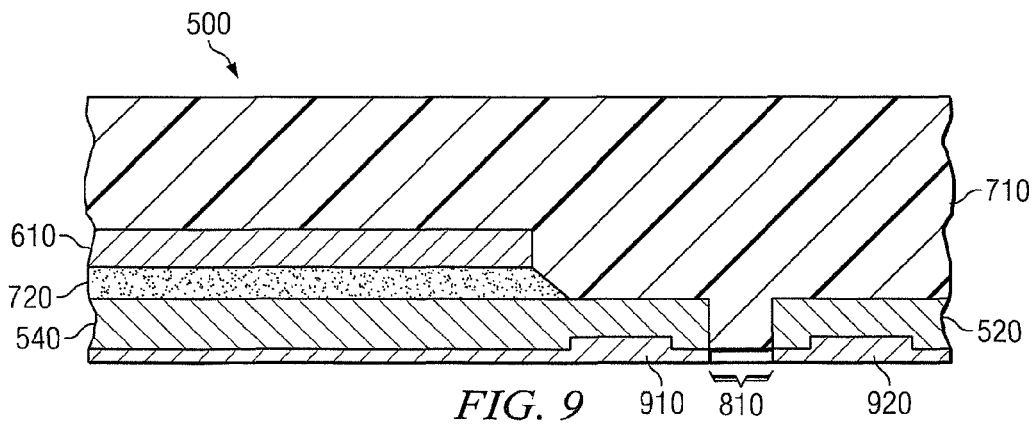
FIG. 9 illustrates a sectional side view of the portion of the exemplary QFN integrated circuit package shown in FIG. 7 in which solder has been applied to the bottom of the QFN integrated circuit package and in which the solder has filled the solder slots in the bottom of the QFN integrated circuit package.

Solder is used to fasten the bottom of the integrated circuit package 500 to a printed circuit board (not shown). As shown in FIG. 9, a layer of solder 910 is applied to the bottom of die pad 540. The solder 910 fills the interior of solder slot 550. A layer of solder 920 is applied to the bottom of terminal 520. The solder 920 fills the interior of solder slot 530. A gap of width 810 exists between solder layer 910 and solder layer 920 where no solder is placed.

The solder can be applied by electro-plating or by stencil printing of solder paste. An electro-plated solder or tin will be very thin and will therefore not fill the slot. However, this thin plating is uniform and makes the slot and the remaining leadframe area solderable. The stencil-printed solder paste is applied to this electro-plated solder, in the solder slot area only, to fill the slot. The paste is subjected to heating that causes the paste to reflow and fill the slot.

Furthermore, solid solder in the form of spheres and bars may be dropped into the solder slots. With the help of pre-applied solder flux, the solid solder will melt when the integrated circuit package is subjected to solder melting temperature. The molten solder fills the slot, and protrudes beyond the surface of the leadframe. This additional solder protrusion will increase the distance between the leadframe and the printed circuit board, and reduce stress on the solder joint.

Figure 10:
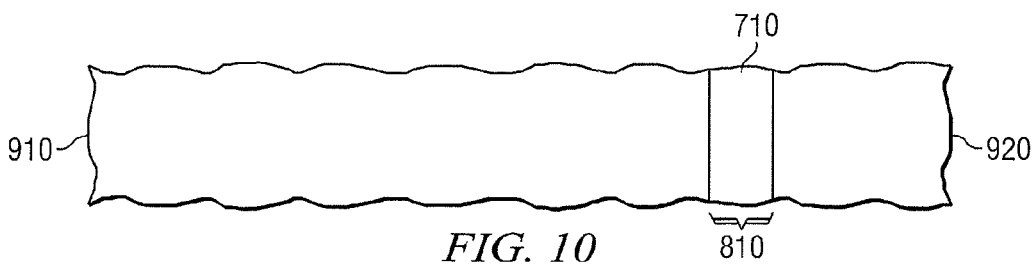
FIG. 10 illustrates a bottom view of the portion of the exemplary QFN integrated circuit package shown in FIG. 9.

FIG. 10 illustrates a bottom view of the sectional portion of the integrated circuit package 500 shown in FIG. 9. Solder layer 910 is applied to die pad 540 and attaches die pad 540 to an underlying printed circuit board (not shown). Solder layer 920 is applied to terminal 520 and attaches terminal 520 to the underlying printed circuit board (not shown). Mold compound material 710 between die pad 540 and terminal 520 may be seen through the gap of width 810 between solder layer 910 and solder layer 920.

The portion of solder 910 that fills solder slot 550 increases the strength of the solder bond between die pad 540 and the underlying printed circuit board (not shown). The portion of solder 920 that fills solder slot 530 increases the strength of the solder bond between terminal 520 and the underlying printed circuit board (not shown). The increased solder bond strength improves solder joint reliability in integrated circuit package 500.

Figure 11:
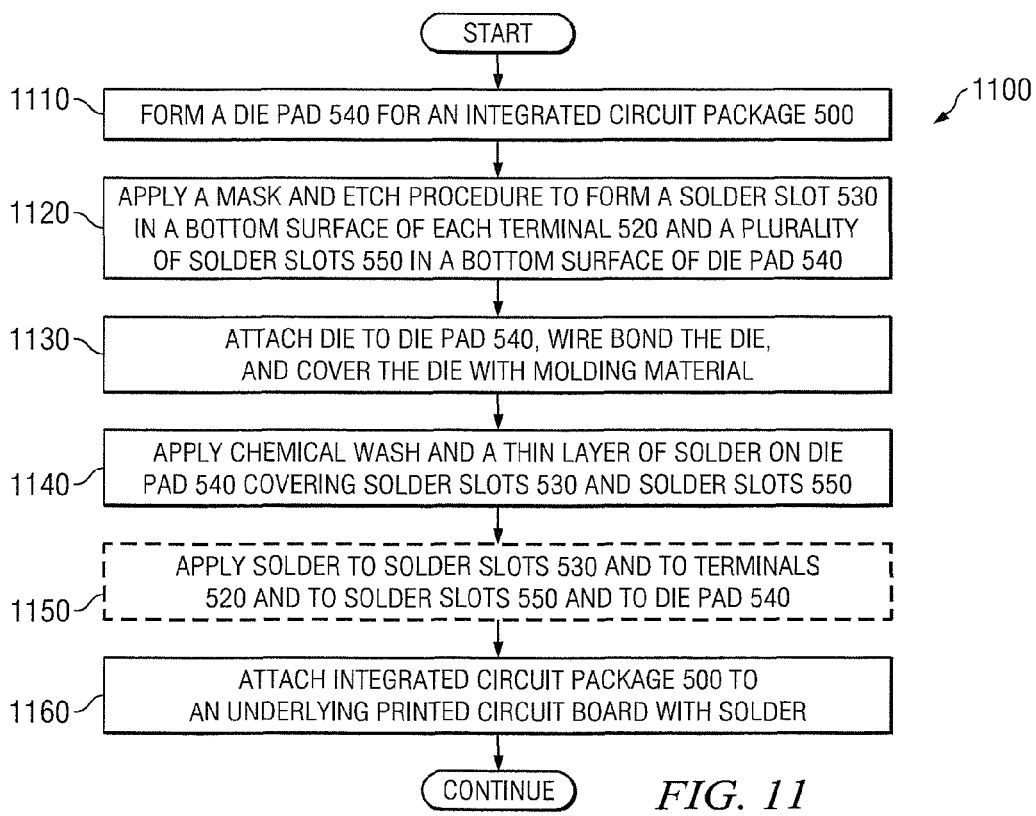
FIG. 11 illustrates a flow chart of an advantageous embodiment of a method of the present disclosure for improving solder joint reliability in a QFN integrated circuit package.

FIG. 11 illustrates a flow chart of an advantageous embodiment of a method of the present disclosure for improving solder joint reliability in an integrated circuit package. The steps of the method are generally denoted with reference numeral 1100.

First a die pad 540 for an integrated circuit package 500 is formed (step 1110). Then a mask and etch procedure is applied (1) to form a solder slot 530 in a bottom surface of each terminal 520 of a plurality of terminals 520 of the integrated circuit package 500, and (2) to form a plurality of solder slots 550 in the bottom surface of die pad 540 (step 1120).

The integrated circuit die 610 is attached to the die pad 540, the die 610 is wire bonded, and the die 610 is covered with molding material 710 (step 1130). A chemical wash is then applied and a thin layer of solder is applied to die pad 540 that covers solder slots 530 and solder slots 550 (step 1140).

The next step is an optional step in which additional solder is applied to the solder slots 530 and to the terminals 520 and to the solder slots 550 and to the die pad 540 (step 1150). If sufficient solder is placed on the die pad 540 and over the solder slots 530 and over the solder slots 550 in step 1140, then it is not necessary to add the optional additional solder in step 1150. Because step 1150 is an optional step, the outline box of step 1150 is shown in dotted outline in FIG. 11.

The integrated circuit package 500 is then attached with solder to an underlying printed circuit board (not shown) (step 1160). The solder within solder slots 530 and within solder slots 550 provide additional strength to the solder bond between the integrated circuit package 500 and the underlying printed circuit board (not shown).

Although the subject matter of the present disclosure has been described in detail, those skilled in the art will understand that various changes, substitutions, and alterations herein may be made without departing from the spirit and scope of the disclosure it its broadest form.

What is claimed is:

1. A method for manufacturing an integrated circuit package, the method comprising:
   forming at least a first solder slot in a bottom surface of at least one terminal of the integrated circuit package; and
   forming a die pad having a plurality of second solder slots in a bottom surface of the die pad, each of the first and second solder slots comprising a region recessed with respect to surrounding regions of the respective terminal and die pad and configured to be filled with solder in forming a conductive connection,
   wherein the plurality of second solder slots are positioned outside of a perimeter of an integrated circuit die mounted on the die pad.

2. The method as set forth in claim 1, further comprising:
   forming a plurality of the second solder slots in the bottom surface of the die pad of the integrated circuit package.

3. The method as set forth in claim 2, further comprising:
   aligning a portion of a plurality of the first solder slots in each of a plurality of terminals including the first terminal with a portion of the plurality of the second solder slots in the bottom surface of the die pad.

4. The method as set forth in claim 3, wherein each first solder slot in the bottom surface of each of the plurality of terminals has one of: a square shape, a rectangular shape, an L shape, a circular shape, an oval shape and an irregular shape.

5. The method as set forth in claim 3, wherein each solder slot in the bottom surface of each of the plurality of terminals is approximately fifty five hundredths of a millimeter in length, and approximately forty hundredths of a millimeter in width, and approximately five hundredths of a millimeter in depth.

6. The method as set forth in claim 2, wherein each solder slot of the plurality of solder slots in the bottom surface of the die pad has one of: a square shape, a rectangular shape, an L shape, a circular shape, an oval shape and an irregular shape.

7. The method as set forth in claim 2, wherein each solder slot of the plurality of solder slots in the bottom surface of the die pad is approximately fifty five hundredths of a millimeter in length, and approximately forty hundredths of a millimeter in width, and approximately five hundredths of a millimeter in depth.

8. The method as set forth in claim 1, wherein the first solder slot in the bottom surface of the at least one terminal has a same size as a corresponding second solder slot in the bottom surface of the die pad.

9. The method as set forth in claim 1, wherein the second solder slots in the bottom surface of the die pad have a depth equal to approximately fifty percent of a thickness of the die pad.

10. A method of forming an integrated circuit package, the method comprising:
   forming a plurality of terminals, wherein each terminal has portions that form a first solder slot in a bottom surface of the respective terminal; and
   forming a die pad having a plurality of second solder slots in a bottom surface of the die pad, each of the first and second solder slots comprising a region recessed with respect to surrounding regions of the respective terminal and die pad and configured to be filled with solder in forming a conductive connection, wherein the plurality of second solder slots are positioned outside of a perimeter of an integrated circuit die mounted on the die pad.

11. The method as set forth in claim 10, wherein a portion of each first solder slot in the plurality of terminals is aligned with a portion of one of the second solder slots in the bottom surface of the die pad.

12. The method as set forth in claim 10, wherein each first solder slot in the plurality of terminals has one of: a square shape, a rectangular shape, an L shape, a circular shape, an oval shape and an irregular shape.

13. The Method as set forth in claim 10, wherein each first solder slot in the plurality of terminals is approximately fifty five hundredths of a millimeter in length, and approximately forty hundredths of a millimeter in width, and approximately five hundredths of a millimeter in depth.

14. The method as set forth in claim 10, wherein each second solder slot in the bottom surface of the die pad has one of: a square shape, a rectangular shape, an L shape, a circular shape, an oval shape and an irregular shape.

15. The method as set forth in claim 10, wherein each second solder slot in the bottom surface of the die pad is approximately fifty five hundredths of a millimeter in length, and approximately forty hundredths of a millimeter in width, and approximately five hundredths of a millimeter in depth.

16. The method as set forth in claim 10, wherein each first solder slot in the bottom surface of one of the terminals has a same size as a corresponding second solder slot in the bottom surface of the die pad.

17. The method as set forth in claim 10, wherein the second solder slots in the bottom surface of the die pad have a depth equal to approximately fifty percent of a thickness of the die pad.

18. A method of forming an integrated circuit package, comprising:

forming an integrated circuit die;

forming a die pad, the integrated circuit die mounted on the die pad, the die pad having a plurality of first solder slots in a bottom surface of the die pad; and forming a terminal having a second solder slot in a bottom surface of the terminal, each of the first and second solder slots comprising a region recessed with respect to surrounding regions of the respective terminal and die pad and configured to be filled with solder in forming a conductive connection, wherein the plurality of first solder slots are positioned outside of a perimeter of the integrated circuit die mounted on the die pad.

19. The method as set forth in claim 18, wherein the terminal comprises one of a plurality of terminals, each terminal having a second solder slot in a bottom surface of the terminal.

20. The method as set forth in claim 18, wherein each second solder slot in the bottom surfaces of the terminals has a same size as a corresponding first solder slot in the bottom surface of the die pad.

\* \* \* \* \*